(12) United States Patent
Leong

(10) Patent No.: US 8,594,594 B2
(45) Date of Patent: Nov. 26, 2013

(54) CIRCUITS AND METHODS FOR COMBINING SIGNAL POWER

(75) Inventor: Poh Boon Leong, Singapore (SG)

(73) Assignee: Marvell World Trade Ltd., St. Michael (BB)

( * ) Notice: Subject to any disclaimer, the term of this patent is extended or adjusted under 35 U.S.C. 154(b) by 393 days.

(21) Appl. No.: 12/783,017

(22) Filed: May 19, 2010

(65) Prior Publication Data

US 2010/0297968 A1    Nov. 25, 2010

Related U.S. Application Data

(60) Provisional application No. 61/179,592, filed on May 19, 2009.

(51) Int. Cl.
*H01Q 11/12* (2006.01)

(52) U.S. Cl.
USPC ..................... 455/127.1; 455/127.5

(58) Field of Classification Search
USPC ........... 455/127.1–127.5; 333/137, 26, 124 R
See application file for complete search history.

(56) References Cited

U.S. PATENT DOCUMENTS

| | | | |
|---|---|---|---|
| 4,097,708 A | 6/1978 | Bickel | |
| 4,371,845 A | 2/1983 | Pitzalis, Jr. | |
| 5,497,137 A | 3/1996 | Fujiki | |
| 5,652,546 A | 7/1997 | Dent | |
| 6,310,408 B1 * | 10/2001 | Hermann | 340/310.11 |
| 6,389,269 B1 * | 5/2002 | Nanni et al. | 455/127.4 |
| 6,480,699 B1 * | 11/2002 | Lovoi | 455/14 |
| 7,630,693 B2 * | 12/2009 | Liu et al. | 455/127.1 |
| 8,169,081 B1 * | 5/2012 | Jergovic et al. | 257/773 |
| 2006/0284698 A1 * | 12/2006 | Vaisanen | 333/26 |
| 2007/0001765 A1 | 1/2007 | Fujii | |
| 2008/0266020 A1 | 10/2008 | Nosaka | |
| 2010/0081410 A1 * | 4/2010 | Kaido et al. | 455/341 |
| 2010/0327970 A1 * | 12/2010 | Mohamadi | 333/137 |

FOREIGN PATENT DOCUMENTS

JP    59148405 A    8/1984

OTHER PUBLICATIONS

International Preliminary Report on Patentability, PCT Application No. PCT/IB2010/001374, mailed Dec. 1, 2011.
Aoki et al., A Fully-Integrated 1.8-V, 2.8-W, 1.9-GHz, CMOS Power Amplifier, IEEE MTT-S Digest, 2003, Pasadena, CA.

* cited by examiner

*Primary Examiner* — Lana N Le

(57) ABSTRACT

The present disclosure includes techniques for combining signal power. In one embodiment, a plurality of power amplifiers generate amplified signals. A plurality of first transmission lines are electrically coupled outputs of the power amplifiers. Second transmission lines are magnetically coupled to the first transmission lines to receive the amplified signals. The amplified signals propagate down the second transmission lines to a central conductive region to a node. The amplified signals are added at the node. The node is coupled to an antenna terminal.

20 Claims, 4 Drawing Sheets

CIRCUITS AND METHODS FOR COMBINING SIGNAL POWER

CROSS REFERENCE TO RELATED APPLICATIONS

The present disclosure claims the benefit of priority from U.S. Provisional Application No. 61/179,592, filed May 19, 2009, the disclosure of which is incorporated herein by reference in its entirety.

BACKGROUND

The present disclosure relates to combining signals in electronic circuits.

Unless otherwise indicated herein, the approaches described in this section are not prior art to the claims in this application and are not admitted to be prior art by inclusion in this section.

Many electronic circuits process signals to perform a wide variety of functions. Signals in such electronic circuits typically comprise changing voltage and current values, where the voltage and current variations may represent information, for example. One limitation on many electronic systems is the amount of power the electronic system can generate to transmit voltage and current signals. For example, a wireless system may be required to transmit radio frequency ("RF") signals to an antenna at a minimum power level to ensure reception of the signal. However, the power output of electronic circuits in the system may be limited by such factors as supply voltage or supply current, for example.

For instance, as transistor sizes decrease, electronic circuits using such transistors are able to increase in speed and achieve higher frequency operation. However, as the transistor sizes decrease, the breakdown voltages also decrease, and the supply voltages must be reduced to ensure safe operation of the devices. Lower supply voltages, in turn, reduce the amount of power that can be generated by the transistors in such devices. In a wireless system, for example, lower supply voltages reduce the power available to drive an antenna. This, in turn, reduces the distance the wireless system can transmit RF signals.

SUMMARY

Embodiments of the present disclosure include techniques for combining signal power. One embodiment includes an apparatus comprising a plurality of power amplifiers, a plurality of first transmission lines, a plurality of second transmission lines, and a central conductive region. Each power amplifier has an input and an output. The outputs of the power amplifiers are electrically coupled to different first transmission lines. The central conductive region has a node coupled to an antenna terminal. The second transmission lines are coupled to a different output of the plurality of power amplifiers through respective first transmission lines, and each of the second transmission lines includes an end electrically coupled to the central conductive region. Each power amplifier receives an input signal and produces an output signal, and the output signals of the power amplifiers are magnetically coupled from the first transmission lines to the second transmission lines and added at the node of the central conductive region.

In one embodiment, the first transmission lines are configured to have a first impedance and the second transmission lines are configured to have a second impedance.

In one embodiment, each of the first transmission lines and each of the second transmission lines have an elongated shape, and the output of each power amplifier is electrically coupled to one or more first transmission lines configured in parallel with one of the second transmission lines.

In one embodiment, the output of each power amplifier is electrically coupled to one of the first transmission lines configured in parallel with one of the second transmission lines.

In one embodiment, the output of each power amplifier comprises a differential output, and the differential output of each power amplifier is electrically coupled to two of the first transmission lines configured in parallel with one of the second transmission lines.

In one embodiment, each power amplifier comprises a first power amplifier having a first differential output and a second power amplifier having a second differential output. A first output of the first differential output is electrically coupled to a first one of the first transmission lines configured in parallel with one of the second transmission lines. A first output of the second differential output is electrically coupled to a second one of the first transmission lines configured in parallel with one of the second transmission lines. A second output of the first differential output is coupled to a first end of a third transmission line, and a second output of the second differential output is coupled to a second end of the third transmission line. The third transmission line has a first portion configured in parallel with a first side of the second transmission line and a second portion configured in parallel with a second side, opposite the first side, of the second transmission line.

In one embodiment, the central conductive region is circular and the node is at a center of the circular central conductive region.

In one embodiment, each of the first transmission lines and second transmission lines are rectangular.

In one embodiment, the first transmission lines are arranged in parallel with the second transmission lines.

In one embodiment, the second transmission lines extend radially outward from the node.

In one embodiment, the second transmission lines are separated by equal angles around the node.

In one embodiment, the plurality of power amplifiers, the plurality of first transmission lines, the plurality of second transmission lines, and the central conductive region are on a single integrated circuit.

Another embodiment includes a wireless system comprising an antenna and embodiments of an apparatus described herein.

Another embodiment includes a method comprising amplifying power of a signal in a plurality of power amplifiers to produce a plurality of amplified signals, electrically coupling the amplified signals to a plurality of first transmission lines, where the plurality of amplified signals are electrically coupled to a different one or more of the first transmission lines, magnetically coupling the amplified signals from the plurality of first transmission lines to a plurality of second transmission lines, where each of the second transmission lines receives an amplified signal through respective first transmission lines, electrically coupling the amplified signals from each of the second transmission lines to a central conductive region to produce an added amplified signal, and electrically coupling the added amplified signal to an antenna terminal.

In one embodiment, the method further comprises transforming an impedance using the first transmission lines and second transmission lines.

In one embodiment, each of the first transmission lines and each of the second transmission lines have an elongated shape, and wherein each amplified signal is electrically coupled to one or more first transmission lines configured in parallel with one of the second transmission lines.

In one embodiment, each amplified signal is electrically coupled to one of the first transmission lines configured in parallel with one of the second transmission lines.

In one embodiment, each amplified signal comprises a differential amplified signal, and wherein each amplified signal is electrically coupled to two of the first transmission lines configured in parallel with one of the second transmission lines.

In one embodiment, each amplified signal comprises a first differential output signal and a second differential output signal, wherein a first component of the first differential output signal is electrically coupled to a first one of the first transmission lines configured in parallel with one of the second transmission lines, wherein a first component of the second differential output signal is electrically coupled to a second one of the first transmission lines configured in parallel with said one of the second transmission lines, and wherein a second component of the first differential output signal and a second component of the second differential output signal are coupled to opposite ends of a third transmission line having a first portion configured in parallel with a first side of said one of the second transmission lines and a second portion configured in parallel with a second side, opposite the first side, of said one of the second transmission lines.

The following detailed description and accompanying drawings provide a more thorough understanding of the nature and advantages of the present invention.

DETAILED DESCRIPTION

Described herein are techniques for combining signal power. In the following description, for purposes of explanation, numerous examples and specific details are set forth in order to provide a thorough understanding of particular embodiments. The circuits and methods disclosed herein may be used in a variety of electronic systems. Further, the circuits and methods described herein may be implemented on an integrated circuit (IC). Particular embodiments as defined by the claims may include some or all of the features in these examples alone or in combination with other features described below, and may further include modifications and equivalents of the features and concepts described herein.

Figure 1:
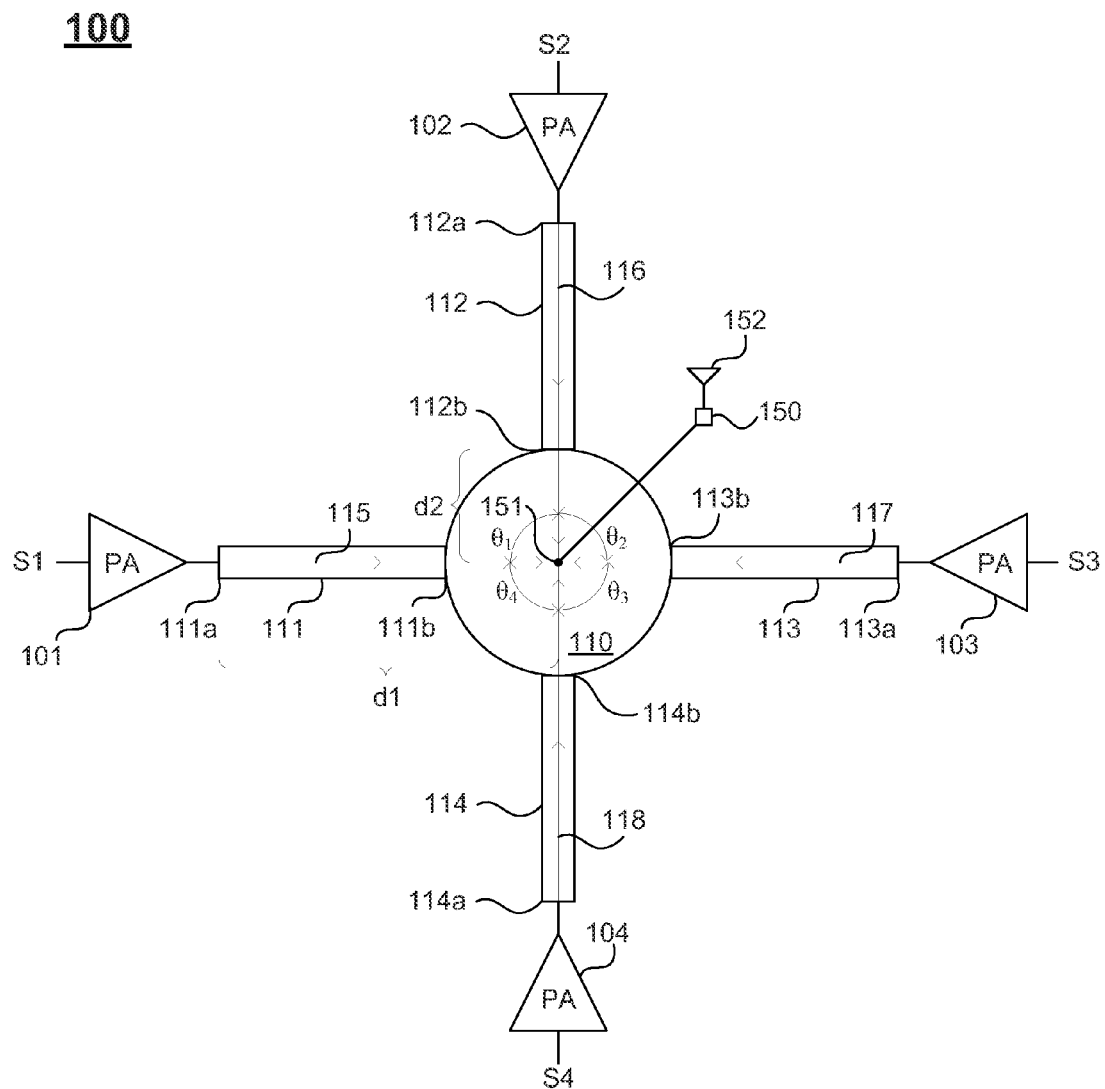
FIG. 1 illustrates a signal power combiner circuit according to one embodiment.

FIG. 1 illustrates a signal power combiner circuit 100 according to one embodiment. A radio frequency ("RF") system may generate signals S1-S4 to be transmitted on an antenna 152. Signal power combiner circuit 100 includes multiple power amplifiers 101-104 that receive signals S1-S4, respectively. For example, power amplifier 101 includes an input to receive input signal 51 and produces an output signal on an output of power amplifier 101. Similarly, power amplifier 102 includes an input to receive input signal S2 and produces an output signal on an output of power amplifier 102. Likewise, power amplifier 103 includes an input to receive input signal S3 and produces an output signal on an output of power amplifier 103. In this example, four (4) signals are being combined. Thus, power amplifier 104 includes an input to receive input signal S4 and produces an output signal on an output of power amplifier 104. Signals S1-S4 may be the same signal, for example, which is transmitted to antenna 152 using four different power amplifiers 101-104 and a combiner circuit to increase transmission power.

Signal power combiner circuit 100 includes transmission lines 111-114. Generally, transmission lines 111-114 have an elongated shape, such as a rectangle, with a first end and a second end. In this example, a first end of each transmission line 111-114 is coupled to a different output of the power amplifiers 101-104 and a second end of each transmission line 111-114 is electrically coupled to a central conductive region 110. Electrical coupling may be established by connecting conductive elements such as metallization or a conductive region of an integrated circuit, for example. As described in more detail below, output signals from each power amplifier 101-104 are magnetically coupled to corresponding transmission lines 111-114. Magnetic coupling may be established by using inductance to couple signals between conductive elements that are not connected by a conductor. For example, inductance of transmission lines may be used to magnetically couple signals from a first transmission line to a second transmission line if the second transmission line is within the magnetic field of a signal propagating in the first transmission line. Once the output signals are coupled to transmission lines 111-114, each output signal propagates toward central conductive region 110 where the signal power is added at a node 151. Node 151 of central conductive region 110 is coupled to an antenna terminal 150 (e.g., a pad or pin of an integrated circuit), and antenna terminal 150 may be coupled to an antenna 152 in a system application (e.g., a wireless system).

In this example, transmission line 111 includes a first end 111a coupled to an output of power amplifier 101. A second end 111b of transmission line 111 is electrically coupled to central conductive region 110. Similarly, transmission line 112 includes a first end 112a coupled to an output of power amplifier 102. A second end 112b of transmission line 112 is electrically coupled to central conductive region 110. Likewise, transmission line 113 includes a first end 113a coupled to an output of power amplifier 103. A second end 113b of transmission line 113 is electrically coupled to central conductive region 110. Finally, in this example, transmission line 114 includes a first end 114a coupled to an output of power amplifier 104. A second end 104b of transmission line 114 is electrically coupled to central conductive region 110.

In this example, central conductive region 110 is circular with node 151 at a center of the circular central conductive region. Furthermore, each transmission line 111-114 is rectangular and configured to extend radially outward from node 151. Each transmission line 111-114 is configured to form a path between the first ends 111a-114a and node 151. In this example, transmission lines 111-114 form straight line paths (illustrated by arrows 115, 116, 117, and 118) between each first end 111a-114a and node 151 such that the power of the output signals add at node 151. Accordingly, each first end 111a-114a is located an equal first distance, d1, from node 151 and each second end 111b-114b is located an equal second distance, d2, from node 151 so that the power amplifier output signals are added at node 151. As one example of implementation, transmission lines 111-114 and central conductive region 110 may be a single metallization pattern on a single semiconductor integrated circuit, and node 151 may be coupled to an antenna terminal using a via between metallization layers.

In this example, transmission lines 111-114 are separated by angles around node 151. For instance, transmission line 111 is separated from transmission line 112 by an angle $\theta_1$. Similarly, transmission line 112 is separated from transmission line 113 by an angle $\theta_2$. Likewise, transmission line 113 is separated from transmission line 114 by an angle $\theta_3$. Finally, in this example, transmission line 114 is separated from transmission line 111 by an angle $\theta_4$. Here, $\theta_1$, $\theta_2$, $\theta_3$, and $\theta_4$ are equal angles. Therefore, since central conductive region 110 is a circle in this example, the transmission lines 111-114 are distributed at equal distances apart from each other around the perimeter of central conductive region 110.

Figure 2:
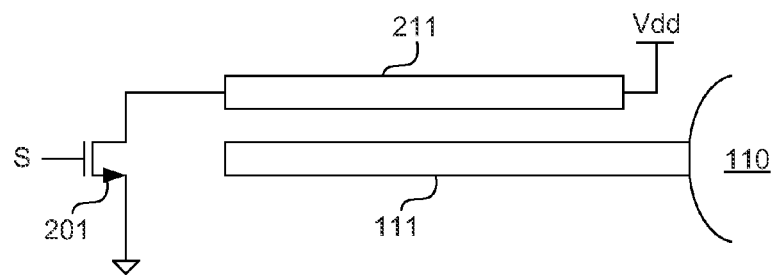
FIG. 2 illustrates magnetic coupling according to one embodiment.

FIG. 2 illustrates magnetic coupling according to one embodiment. Circuit 200 in FIG. 2 shows a power amplifier output stage including a transistor 201. In this example, transistor 201 is an NMOS transistor including a gate, a source, and a drain. The gate of transistor 201 receives a signal S. The source of transistor 201 is coupled to ground and the drain is coupled to one end of a transmission line 211. The opposite end of transmission line 211 is coupled to a supply voltage Vdd. Transmission line 211 is rectangular and configured in parallel with another transmission line 111. Transmission line 111 is electrically coupled to a central conductive region 110 as described above. Transmission lines 211 and 111 both include parasitic inductance. Transmission lines 211 and 111 are not physically in contact with each other, but are magnetically coupled to each other by the magnetic fields generated by the parasitic inductance. Transmission lines 211 and 111 may be metal lines separated by an oxide, for example. The amount of magnetic coupling is based, in part, on the distance between transmission lines 211 and 111. Thus, transmission lines 211 and 111 are positioned sufficiently close to each other to achieve a desired amount of magnetic coupling. The application of signal S at the gate of transistor 201 causes current to flow in transmission line 211. A change in current in transmission line 211, in turn, generates a magnetic field, which causes corresponding changes in current in transmission line 111. Accordingly, signal S is translated into a current and magnetically coupled from transmission line 211 to transmission line 111. The signal propagates down transmission line 111 into central conductive region 110 to node 151 as described above.

In one embodiment, transmission lines 211 and 111 may be configured to transform the impedance of the transmission line. For example, impedance may be a function of the length, width, and thickness of the transmission line. Transmission line 211 may be configured to have one impedance (e.g., 25 ohms) and transmission line 111 may be configured to have another impedance (e.g., 50 ohms).

Figure 3:
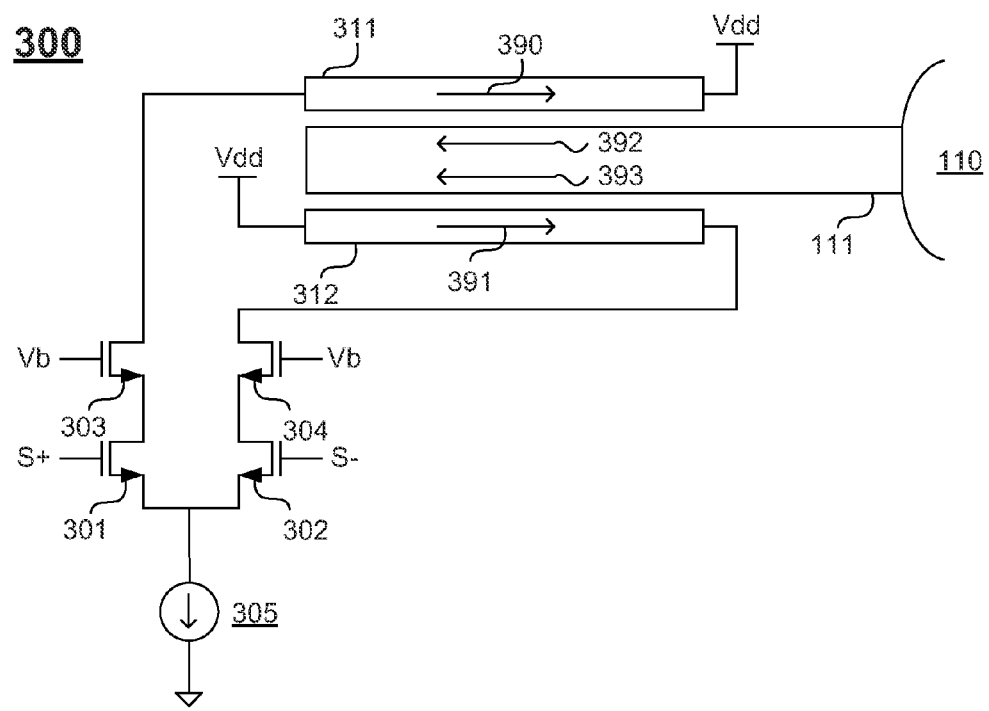
FIG. 3 illustrates magnetic coupling according to another embodiment.

FIG. 3 illustrates magnetic coupling according to another embodiment. In this example, a power amplifier includes a differential output as illustrated by circuit 300. Circuit 300 includes transistor 301 having a gate coupled to receive signal S+ and transistor 302 having a gate coupled to receive signal S−. Signals S+ and S− are components of a differential signal. Sources of transistors 301 and 302 are coupled through a bias current 305 to ground. A drain of transistor 301 is coupled to a source of cascode transistor 303 and a drain of transistor 302 is coupled to a source of cascode transistor 304. Gates of transistors 303 and 304 are coupled to bias voltage Vb and drains of transistors 303 and 304 are differential outputs of the power amplifier. In this example, the power amplifier is electrically coupled to two transmission lines 311 and 312 configured in parallel with transmission line 111. Each transmission line 311 and 312 is magnetically coupled to transmission line 111 as described above in FIG. 2. The drain of transistor 303 is coupled to a first end of transmission line 311 and the opposite end of transmission line 311 is coupled to supply voltage Vdd. Similarly, the drain of transistor 304 is coupled to a first end of transmission line 312 and the opposite end of transmission line 312 is coupled to supply voltage Vdd.

Since the signals on the drains of transistor 303 and 304 are differential, the drains are connected to opposite ends of the transmission lines 311 and 312, relative to transmission line 111, so that the signals are magnetically coupled to transmission line 111 constructively (e.g. so the currents do not cancel each other out). Specifically, the drain of transistor 303 is coupled to a first end of transmission line 311 that is adjacent to a terminal end of transmission line 111 that is farthest away from the central conductive region 110. A second end of transmission line 311 is adjacent to a side of transmission line 111 toward the central conductive region 110. A current 390 in transmission line 311 generates a magnetic field, which causes a corresponding current 392 having an opposite polarity to current 390. In order to generated a current 393 having the same polarity as current 392 (so the currents do not cancel), the drain of transistor 304 is coupled to an end of transmission line 312 that is adjacent to another side of transmission line 111 toward the central conductive region 110. A second end of transmission line 312 is adjacent to the terminal end of transmission line 111 that is farthest away from the central conductive region 110. In this example, transmission lines 303 and 304 are the same length to produce equal magnetic coupling from transmission lines 311 and 312 to transmission line 111.

Figure 4:
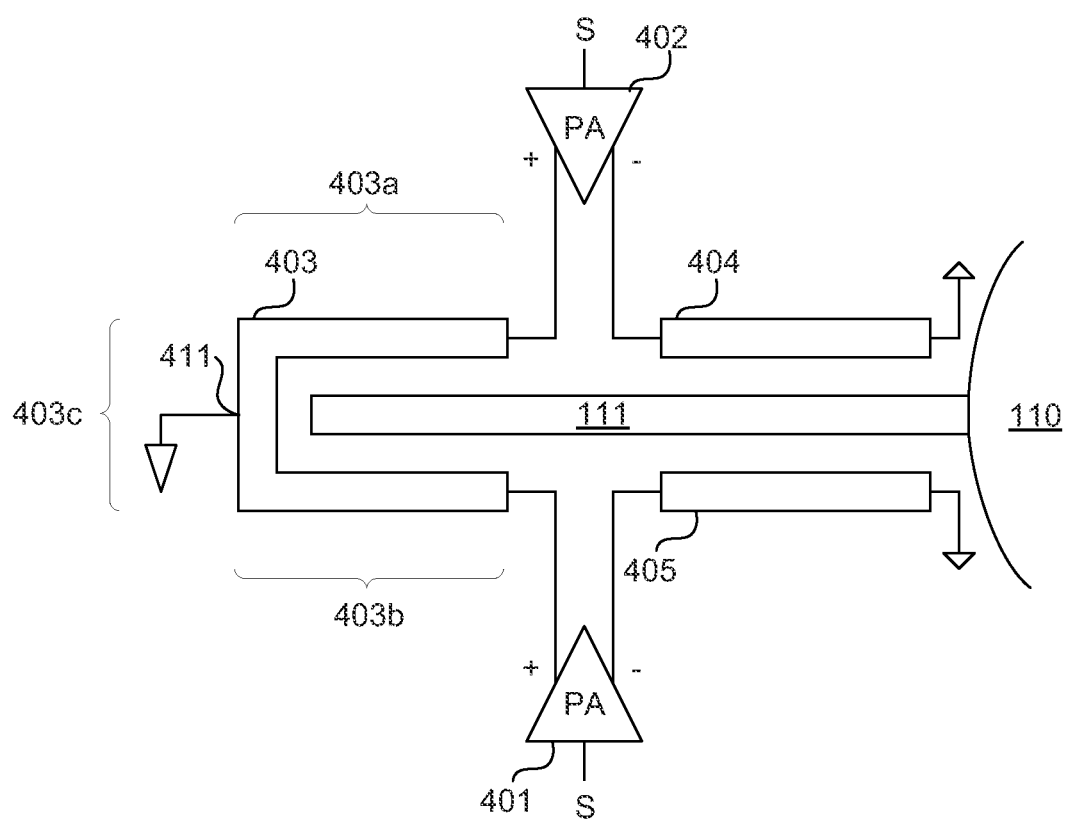
FIG. 4 illustrates magnetic coupling according to yet another embodiment.

FIG. 4 illustrates magnetic coupling according to yet another embodiment. As illustrated in circuit 400, two power amplifiers 401 and 402 having differential outputs are magnetically coupled to transmission line 111 and central conductive region 110. In this example, power amplifiers 401 and 402 receive signal S. Power amplifier 401 includes a positive output ("+") electrically coupled to transmission line 403 and a negative output ("−") electrically coupled to transmission line 405. Similarly, power amplifier 402 includes a positive output ("+") electrically coupled to transmission line 403 and a negative output ("−") electrically coupled to transmission line 404. Transmission lines 404 and 405 are rectangular in shape and configured in parallel with transmission line 111. One end of transmission line 404 is coupled to ground (e.g., virtual ground) adjacent to a first side of transmission line 111 and toward central conductive region 110. The opposite end of transmission line 404 is coupled to the negative output of power amplifier 402 farther away from the central conductive region 110 in the direction of the terminal end of transmission line 111. Similarly, one end of transmission line 405 is coupled to ground (e.g., virtual ground) adjacent to a second side of transmission line 111, opposite the first side, and toward central conductive region 110. The opposite end of transmission line 405 is coupled to the negative output of power amplifier 401 farther away from the central conductive region 110 in the direction of the terminal end of transmission line 111.

The positive outputs of power amplifiers 401 and 402 are electrically coupled to opposite ends transmission line 403. Transmission line 403 is coupled to ground (e.g., virtual ground) at a midpoint 411. Transmission line 403 includes a portion 403a configured in parallel with the first side of transmission line 111. The portion 403a of transmission line 403 runs parallel to the first side of transmission line 111 to the terminal end of transmission line 111. Transmission line 403 includes another portion 403b configured in parallel with the second side of transmission line 111, opposite the first side. The portion 403b of transmission line 403 also runs parallel to the second side of transmission line 111 to the terminal end of transmission line 111. In this example, the first portion 403a and the second portion 403b are coupled together by a third portion 403c configured perpendicular to and around the terminal end of transmission line 111. Signals at the outputs of power amplifiers 401 and 402 are magnetically coupled from transmission lines 403-405 to transmission line 111 and propagate to a node in central conductive region 110.

While the above examples show transmission lines as parallel rectangular shapes, it is to be understood that other elongated shapes arranged adjacent to each other may be used to achieve magnetic coupling described above. Additionally, in some implementations, the power amplifiers, the transmission lines electrically coupled to the outputs of the power amplifiers, the central conductive region, and the transmission lines electrically coupled to the central conductive region are integrated on a single integrated circuit. A single integrated circuit may include a pad or pin coupled to an antenna for use in a wireless system, for example.

Figure 5:
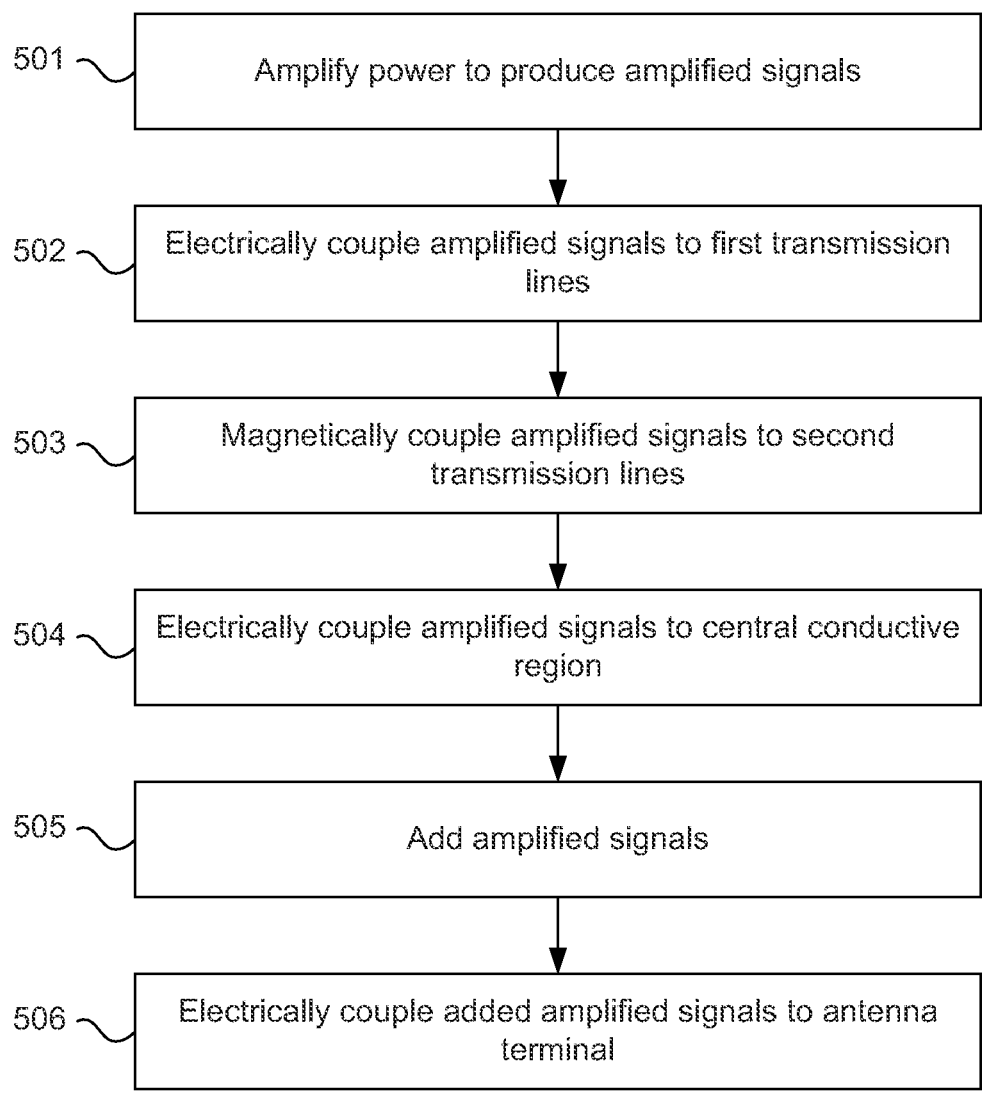
FIG. 5 illustrates a method of combining power according to one embodiment.

FIG. 5 illustrates a method of combining power according to one embodiment. At 501, power is amplified in a multiple power amplifiers to produce multiple amplified signals. At 502, the amplified signals are electrically coupled to first transmission lines. As described above, each amplified signal is electrically coupled to a different one or more first transmission lines. For example, with reference to FIG. 2, each amplified signal may be coupled to a single transmission line 211. As an alternative example, each amplified signal may be coupled to a multiple transmission lines 311-312 in FIG. 3 or transmission lines 403-405 in FIG. 4. At 503, the amplified signals are magnetically coupled from the first transmission lines to second transmission lines. Each of the second transmission lines receives a different amplified signal through the first transmission lines as in the examples described above. At 504, the amplified signals are electrically coupled from each of the second transmission lines to a central conductive region. At 505, the amplified signals are added at a node in the central conductive region to produce an added amplified signal. At 506, the added amplified signal is electrically coupled from the node in the central conductive region to an antenna terminal, which may be connected to an antenna in a wireless system, for example.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. For example, one or more steps of methods or processes discussed above may be performed in a different order (or concurrently) and still achieve desirable results. Based on the above disclosure and the following claims, other arrangements, embodiments, implementations and equivalents may be employed without departing from the scope of the invention as defined by the claims.

What is claimed is:
1. An apparatus comprising:
a plurality of power amplifiers, each power amplifier having an input and an output;
a plurality of first transmission lines, wherein the output of each of the plurality of power amplifiers is directly coupled to a first end of a different one or more of the first transmission lines, and wherein a second end of each of the first transmission lines is coupled to an output of a voltage source;
a central conductive region, the central conductive region having a node coupled to an antenna terminal; and
a plurality of second transmission lines, wherein each of the second transmission lines is coupled to a different output of the plurality of power amplifiers through respective first transmission lines, wherein each of the second transmission lines includes an end electrically coupled to the central conductive region,
wherein each power amplifier receives an input signal and produces an output signal, and wherein the output signals of the plurality of power amplifiers are magnetically coupled from the first transmission lines to the second transmission lines and added at the node of the central conductive region.

2. The apparatus of claim 1 wherein the first transmission lines are configured to have a first impedance and the second transmission lines are configured to have a second impedance.

3. The apparatus of claim 1 wherein each of the first transmission lines and each of the second transmission lines have an elongated shape, and wherein the output of each power amplifier is electrically coupled to one or more first transmission lines configured in parallel with one of the second transmission lines.

4. The apparatus of claim 2 wherein the output of each power amplifier is electrically coupled to one of the first transmission lines configured in parallel with one of the second transmission lines.

5. The apparatus of claim 2 wherein the output of each power amplifier comprises a differential output, and wherein the differential output each power amplifier is electrically coupled to two of the first transmission lines configured in parallel with one of the second transmission lines.

6. The apparatus of claim 2 wherein each power amplifier comprises a first power amplifier having a first differential output and a second power amplifier having a second differential output, wherein a first output of the first differential output is electrically coupled to a first one of the first transmission lines configured in parallel with one of the second transmission lines, wherein a first output of the second differential output is electrically coupled to a second one of the first transmission lines configured in parallel with said one of the second transmission lines, wherein a second output of the first differential output is coupled to a first end of a third transmission line, and wherein a second output of the second differential output is coupled to a second end of the third transmission line, the third transmission line having a first portion configured in parallel with a first side of said one of the second transmission lines and a second portion configured in parallel with a second side, opposite the first side, of said one of the second transmission lines.

7. The apparatus of claim 1 wherein the central conductive region is circular and the node is at a center of the circular central conductive region.

8. The apparatus of claim 7 wherein each of the first transmission lines and second transmission lines are rectangular, wherein the first transmission lines are arranged in parallel with the second transmission lines, and wherein the second transmission lines extend radially outward from the node.

9. The apparatus of claim 7 wherein the second transmission lines are separated by equal angles around the node.

10. The apparatus of claim 1 wherein the plurality of power amplifiers, the plurality of first transmission lines, the plurality of second transmission lines, and the central conductive region are on a single integrated circuit.

11. A wireless system comprising:
an antenna;
a plurality of power amplifiers, each power amplifier having an input and an output;
a plurality of first transmission lines, wherein the output of each of the plurality of power amplifiers is directly coupled to a first end of a different one or more of the first transmission lines, and wherein a second end of each of the first transmission lines is coupled to an output of a voltage source;
a central conductive region, the central conductive region having a node coupled to an antenna terminal, wherein the antenna terminal is coupled to the antenna; and
a plurality of second transmission lines, wherein each of the second transmission lines is coupled to a different output of the plurality of power amplifiers through respective first transmission lines, wherein each of the second transmission lines includes an end electrically coupled to the central conductive region,
wherein each power amplifier receives an input signal and produces an output signal, and wherein the output signals of the plurality of power amplifiers are magnetically coupled from the first transmission lines to the second transmission lines and added at the node of the central conductive region.

12. A method comprising:
amplifying power of a signal in a plurality of power amplifiers to produce a plurality of amplified signals;
electrically coupling the amplified signals to a plurality of first transmission lines, wherein the amplified signals are directly coupled respectively to first ends of a different one or more of the first transmission lines, and wherein a second end of each of the first transmission lines is coupled to an output of a voltage source;
magnetically coupling the amplified signals from the plurality of first transmission lines to a plurality of second transmission lines, wherein each of the second transmission lines receives an amplified signal through respective first transmission lines;
electrically coupling the amplified signals from each of the second transmission lines to a central conductive region to produce an added amplified signal; and
electrically coupling the added amplified signal to an antenna terminal.

13. The method of claim 12 further comprising transforming an impedance using the first transmission lines and second transmission lines.

14. The method of claim 13 wherein each amplified signal is electrically coupled to one of the first transmission lines configured in parallel with one of the second transmission lines.

15. The method of claim 13 wherein each amplified signal comprises a differential amplified signal, and wherein each amplified signal is electrically coupled to two of the first transmission lines configured in parallel with one of the second transmission lines.

16. The method of claim 13 wherein each amplified signal comprises a first differential output signal and a second differential output signal, wherein a first component of the first differential output signal is electrically coupled to a first one of the first transmission lines configured in parallel with one of the second transmission lines, wherein a first component of the second differential output signal is electrically coupled to a second one of the first transmission lines configured in parallel with said one of the second transmission lines, and wherein a second component of the first differential output signal and a second component of the second differential output signal are coupled to opposite ends of a third transmission line having a first portion configured in parallel with a first side of said one of the second transmission lines and a second portion configured in parallel with a second side, opposite the first side, of said one of the second transmission lines.

17. The method of claim 12 wherein each of the first transmission lines and each of the second transmission lines have an elongated shape, and wherein each amplified signal is electrically coupled to one or more first transmission lines configured in parallel with one of the second transmission lines.

18. The method of claim 12 wherein the central conductive region is circular.

19. The method of claim 18 wherein the central conductive region comprises a node at a center of the central conductive region, and wherein each of the first transmission lines and second transmission lines are rectangular, wherein the second transmission lines extend radially outward from the node, wherein the second transmission lines are separated by equal angles around the node, and wherein one or more of the first transmission lines are configured in parallel with one of the second transmission lines.

20. The method of claim 12 wherein the plurality of power amplifiers, the plurality of first transmission lines, the plurality of second transmission lines, and the central conductive region are on a single integrated circuit.

* * * * *